United States Patent [19]

Miyawaki et al.

[11] Patent Number: 4,843,258
[45] Date of Patent: Jun. 27, 1989

[54] DRIVE CIRCUIT WITH A RING OSCILLATOR FOR A SEMICONDUCTOR DEVICE

[75] Inventors: Masahumi Miyawaki; Sampei Miyamoto; Tamihiro Ishimura, all of Tokyo, Japan

[73] Assignee: Oki Electric Industry Co., Ltd., Tokyo, Japan

[21] Appl. No.: 226,087

[22] Filed: Jul. 29, 1988

[30] Foreign Application Priority Data

Jul. 29, 1987 [JP] Japan ................................ 62-189688

[51] Int. Cl.$^4$ ........................ H03L 1/00; H03K 3/353
[52] U.S. Cl. ............................ 307/296.2; 307/304; 307/270
[58] Field of Search ................. 307/297, 296 R, 304, 307/200 B, 270; 323/282, 283, 284

[56] References Cited

U.S. PATENT DOCUMENTS 4,356,412 10/1982 Moench et al. ..................... 307/304
4,438,346 3/1984 Chuang et al. ..................... 307/297
4,471,290 9/1984 Yamaguchi ......................... 307/304
4,656,369 4/1987 Lou .................................... 307/297
4,705,966 11/1987 VanZanten ......................... 307/297

Primary Examiner—Stanley D. Miller
Assistant Examiner—Timothy P. Callahan
Attorney, Agent, or Firm—Wenderoth, Lind & Ponack

[57] ABSTRACT

A drive circuit for driving a semiconductor device includes a reference voltage level generator for outputting a reference voltage level which is associated with an input voltage level from an external power source. Supplied with the reference level, a ring oscillator oscillates a frequency signal having a predetermined frequency. A drive voltage level generator responds to the reference level and the frequency signal for producing a drive voltage level which is constantly substantially equal to the reference level in synchronism with the frequency signal. The drive voltage level generator feeds power from the external power source to the semiconductor device at the drive level, thereby driving the semiconductor load circuit.

6 Claims, 4 Drawing Sheets

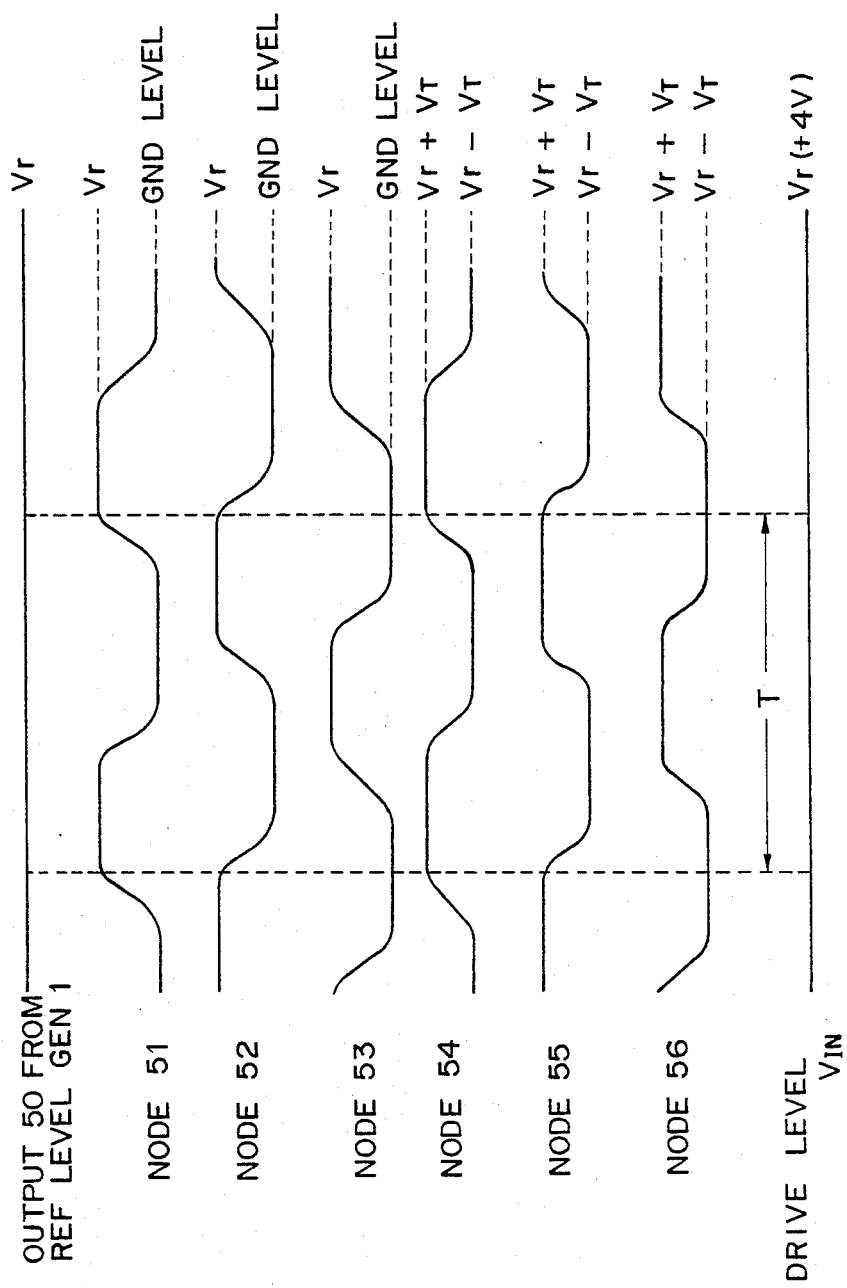

4,843,258

DRIVE CIRCUIT WITH A RING OSCILLATOR FOR A SEMICONDUCTOR DEVICE

BACKGROUND OF THE INVENTION

1. Field of the Invention

The present invention relates to a drive circuit for driving such a semiconductor device as a semiconductor memory device and, more particularly, to a drive circuit for supplying drive power at a predetermined voltage level to a semiconductor device of the type consuming relatively large power.

2. Description of the Prior Art

A drive circuit using a resistance type voltage divider, or potentiometer, is available for supplying power at a predetermined drive voltage level to a semiconductor memory device or similar semiconductor device. This type of prior art drive circuit is constituted by a reference voltage level generator which includes a series connection of a pair of resistors. The resistance values of the two resistors are designed in a predetermined ratio to each other. A semiconductor device is controlled by such a reference level generator. More specifically, a voltage level (e.g. +5 volts) is fed from a power source to between a reference level, or ground, of the reference level generator and one end of one of the two resistors. A drive voltage level (e.g. +4 volts) appears on a node between the resistors in association with the resistance ratio between the resistors and is applied to the semiconductor device.

In the modern semiconductor integrated circuit (IC) art, implementations for higher degrees of integration are searched for with greater keeness than before. In this respect, the prior art reference level generator, or drive circuit, should be mounted integrally with a semiconductor device which is to be driven by the reference level generator. It has already been proposed to implement by an IC a reference voltage generator which generates a regulated output voltage when supplied with an input voltage equal to or higher than a rated input voltage value from the outside and to mount such an IC integrally with a semiconductor device which uses the reference voltage generator.

However, a drive circuit of the type relying on the resistance ratio as stated above consumes inherently large power itself. Should such a driver circuit be built in a semiconductor device to play the role of an internal reference voltage generator, it would be difficult to supply a large current such as 20 to 30 milliamperes to the drive circuit due to the inherent circuit construction and, therefore, driving a semiconductor device which constitutes a heavy load would be impractical.

SUMMARY OF THE INVENTION

It is therefore an object of the present invention to provide a drive circuit for a semiconductor device which consumes a minimum of power and is capable of feeding a relatively large drive current at a predetermined voltage level to the semiconductor device which uses the drive circuit.

In accordance with the present invention, there is provided a drive circuit for driving a semiconductor load circuit including reference voltage level generator means for outputting a reference voltage level which is associated with an input voltage level from an external power source. Ring oscillator means responds to the reference voltage level for oscillating a frequency signal having a predetermined frequency. Drive voltage level generator means is responsive to the reference voltage level and the frequency signal for producing a drive voltage level which is constantly substantially equal to the reference voltage level in synchronism with the frequency signal. The drive voltage level generator means feeds power from the external power source to the semiconductor load circuit at the drive voltage level.

BRIEF DESCRIPTION OF THE DRAWINGS

The objects and features of the present invention will become more apparent the consideration of the following detailed description taken in conjunction with the accompanying drawings in which:

FIG. 5 is a waveform diagram useful for understanding the operation of the drive circuit as shown in FIG. 3.

DESCRIPTION OF THE PREFERRED EMBODIMENT

Figure 1:
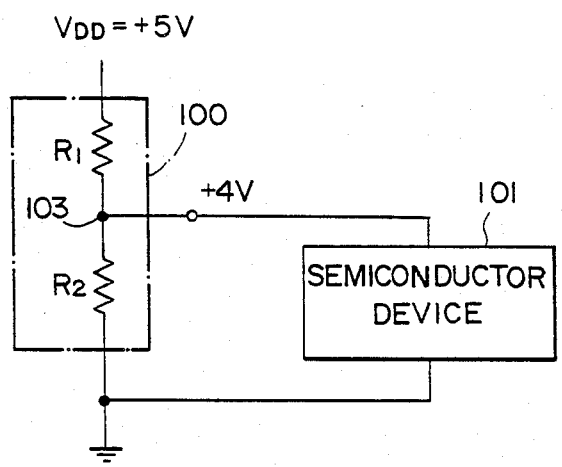
FIG. 1 schematically shows an example of prior art drive circuits which are applicable to semiconductor devices.

To better understand the present invention, a brief reference will be made to a prior art drive circuit for supplying power to such a semiconductor device as a semiconductor memory device at a predetermined drive potential or voltage level, shown in FIG. 1. As shown, the prior art drive circuit is implemented as a reference voltage level generator 100 which includes a series connection of a pair of resistors $R_1$ and $R_2$. The resistance values of the resistors $R_1$ and $R_2$ are selected to have a predetermined ratio to each other. A semiconductor device 101 is controlled by such a reference voltage level generator.

More specifically, a voltage VDD (e.g. +5 volts) is fed from an external power source to between a reference level, or ground, of the reference level generator 100 and one end of the resistor $R_1$. A drive voltage level Vref (e.g. +4 volts) appears on a node 103 between the resistors $R_1$ and $R_2$ in association with the resistance ratio of the resistors $R_1$ and $R_2$ and is applied to the semiconductor device 101 which uses the drive circuit.

Figure 2:
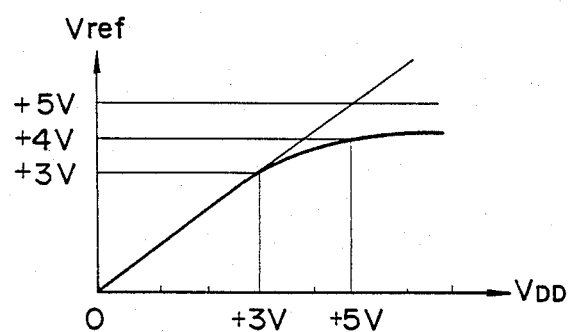
FIG. 2 is a graph plotting a general input and output characteristic of the prior art drive circuit as shown in FIG. 1.

In parallel with the ever increasing degree of integration of ICs, there is an increasing demand for the reference level generator 100 which is built in the semiconductor device 101 as a part of the latter. One approach to meet this demand may be a drive circuit having an input and output characteristic such as shown in FIG. 2 (VDD and Vref being respectively representative of an input and an output) and implemented as a semiconductor circuit which is integrated with the semiconductor device 101.

A problem with the prior art drive circuit which relies on a resistance ratio as stated above is that the drive circuit itself consumes substantial power. Should such a drive circuit be combined with the semiconductor device 101 to serve as the reference voltage generator 100, it would be difficult to supply large current such as 20 to 30 milliamperes due to the inherent circuit construction and, therefore, driving a semiconductor device which constitutes a substantial load would be impractical, as discussed earlier.

Figure 3:
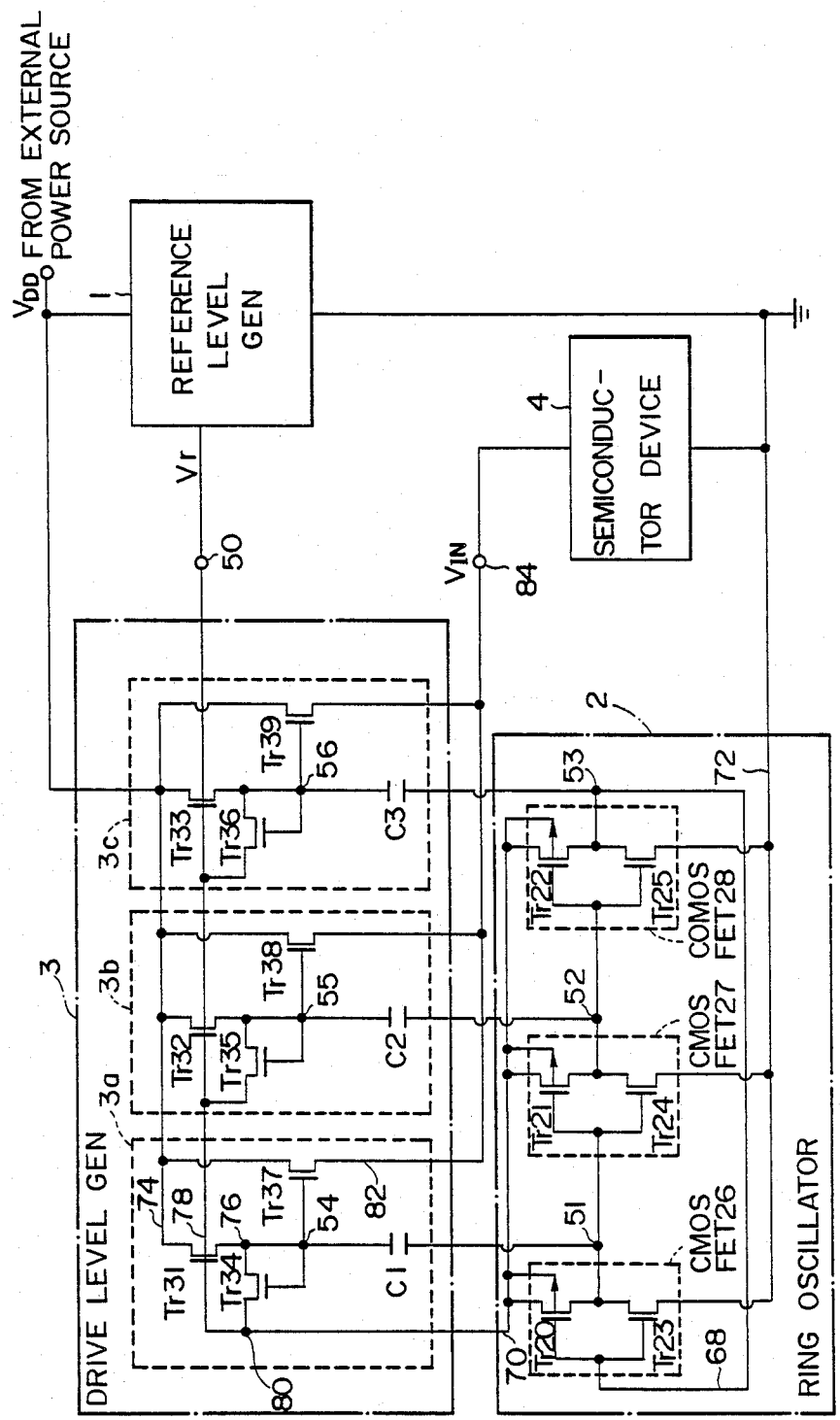
FIG. 3 is a circuit diagram representative of a drive circuit for a semiconductor device in accordacne with the present invention.

Referring to FIG. 3, a drive circuit for a semiconductor device embodying the present invention is shown. As shown, the drive circuit is generally made up of a reference potential or voltage level generator 1, a ring oscillator 2, and a drive voltage level generator 3. Supplied with a source potential VDD from an external power source, the drive circuit applies a predetermined drive voltage level VIN to a semiconductor device 4 such as a semiconductor memory device. The individual blocks 1, 2 and 3 of the drive circuit and the semiconductor device 4 mentioned above may advantageously be provided on a single semiconductor substrate to constitute an IC.

Figure 4:
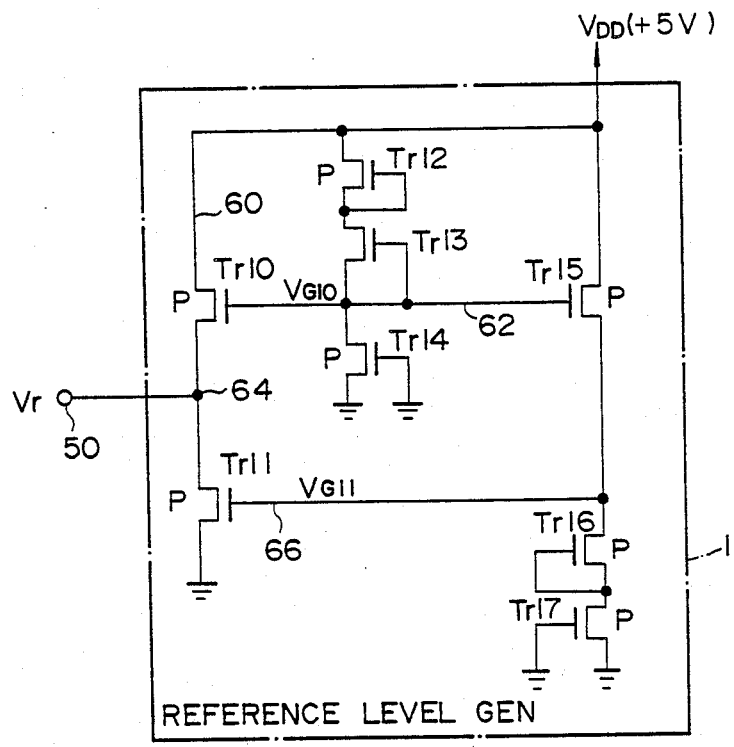
FIG. 4 is a circuit diagram showing a specific construction of a reference potential generator which is included in the drive circuit of FIG. 3.

As shown in FIG. 4, the reference level generator 4 of the illustrative embodiment includes p-channel field effect transistors Tr10 and Tr11, p-channel field effect transistors Tr12, Tr13 and Tr14, and p-channel field effect transistors Tr15, Tr16 and Tr17 which are interconnected as depicted. The voltage VDD from the external power source is applied to the source 60 of the transistor Tr10. A gate potential level VG10 is produced by the transistors Tr12, Tr13 and Tr14 and coupled to the gate 62 of the transistor Tr10. The transistor Tr10 has a drain electrode 64 connected to the source of the transistor Tr11. Applied to the gate 66 of the transistor Tr11 is a gate potential VG11 which is developed by the transistors Tr15, Tr16 and Tr 17. The gate potential level VG10 of the transistor 10 is also applied to the gate of the transistor Tr15. In this construction, the transistors Tr10 and Tr11 have resistance values which are respectively associated with the gate potential levels VG10 and VG11. This allows a reference voltage Vr which is based on the resistance ratio of the transistors Tr10 and Tr11 to appear on an output terminal 50 that is connected to the drain 64 of the transistor Tr10. Advantageously, the transistors Tr11 to Tr17 may be implemented by IGFETs such as MOS FETs.

Referring again to FIG. 3, the ring oscillator 2 includes a group of IGFETs Tr20, Tr21 and Tr 22 such as p-channel MOS FETs, and another group of IGFETs Tr23, Tr24 and Tr25 such as n-channel MOS FETs. These two groups of IGFETs are interconnected in pairs, as shown in FIG. 3. More specifically, the transistor Tr20 has a drain electrode 51 connected to the drain of the transistor Tr23, and the gates 68 of the transistors Tr20 and Tr23 are commonly connected. With this configuration, the transistors Tr20 and Tr23 constitute a complementary MOS FET (CMOS FET) 26. Likewise, the transistors Tr21 and Tr24 and the transistors Tr22 and Tr25 are interconnected to constitute CMOS FETs 27 and 28, respectively. The output or node 51 of the CMOS FET 26 is connected to the gate of the CMOS FET 27. The output or node 52 of the CMOS FET 27 is connected to the gate of the CMOS FET 28. The output or node 53 of the CMOS FET 28 is connected to the gate 68 of the CMOS FET 26. The transistors Tr20, Tr21 and Tr22 have their source electrodes 70 commonly connected to the output terminal 50 of the reference voltage generator 1. On the other hand, the transistors Tr23, Tr24 and Tr25 have their source electrodes 72 connected to ground.

With the above construction, the ring oscillator 2 causes the levels at the nodes 51, 52 and 53 to sequentially and alternately oscillate between a high level and a low level and each at a predetermined period of T, as shown in FIG. 5. The delays in the phase of oscillation at the nodes 51, 52 and 53 relative to each other are dependent upon the operation characteristics of the CMOS FETs 26, 27 and 28. It is to be noted that the high level and the low level stated above are defined by the reference level Vr and the ground level, respectively. Outputs appearing on the nodes 51, 52 and 53 are fed to the drive potential generator 3.

The drive voltage level generator 3 is constructed by interconnecting IGFETs Tr31 to Tr39 such as n-channel MOS FETs and capacitors C1, C2 and C3 as illustrated. Needless to mention, each of the capacitors C1, C2 and C3 may advantageously be implemented with an MOS configuration. More specifically, the drive voltage level generator 3 comprises a parallel connection of three voltage level generating subsections 3a, 3b and 3c. Since the subsections 3a, 3b and 3c are identical in construction, the following description will concentrate on the subsection 3a by way of example.

Basically, the voltage level generating subsection 3a obtains power at the transistor 37 thereof from the external power source at the voltage VDD and applies it to the semiconductor device 4 at a drive voltage VIN which is substantially equal to the reference voltage level Vr. This reference level Vr is outputted by the reference level generator 1, as stated earlier. To implement such a function of the level generating subsection 3a, the output 51 of the CMOS FET 26 which is included in the ring oscillator 2 is fed to the gate of the transistor 37, or node 54, via the capacitor C1. Also connected to the node 54 is the source 76 of the transistor T31 whose drain 74 is connected to the power source VDD. The transistor Tr31 has a gate electrode 78 to which the reference level Vr is applied from the terminal 50. Further connected to the node 54 are the drain and gate of the transistor Tr34 which is supplied with the reference voltage Vr at its source 80. The transistors Tr37 in the individual subsections 3a, 3b and 3c each has a source electrode 82 commonly connected to an output terminal 84 which is in turn connected to the semiconductor device 4, i.e. a circuit to which power should be fed.

In operation, the electrode 54 of the capacitor C1 included in the voltage level generating subsection 3a is at first charted by the transistor Tr31 to a potential level which is lower than the reference level Vr by a threshold voltage of T, i.e. level of Vr−VT. At this instant, a voltage waveform which oscillates between the ground level and the reference level Vr is fed from the node 51 of the associated CMOS FET 26 of the ring oscillator 2 to the capacitor C1 of the voltage level generating subsection 3a. Hence, the capacitor C1 boosts the voltage on the node 54 when the reference level Vr is inputted. The transistor 34 clamps the boosted voltage on the node 54 at a level which is higher than the reference level Vr by the threshold voltage VT of the transistor 34, i.e. level of Vr+VT. The voltage on the node 54, therefore, oscillates between the levels Vr−Vt and Vr+VT in synchronism with the frequency signal which appears on the node 51 of the ring oscillator 2. As a result, while the gate voltage Vr+VT is inputted, a voltage level lower than the gate level by the threshold voltage VT, i.e., drive voltage VIN which is produced by (Vr+VT)−VT is outputted on the source 82 of the transistor 37. This drive level VIN is applied to the semiconductor device 4 via the output terminal 84. At this instant, a drive current for the semiconductor device 4 is fed from the external power source VDD across the drain and source of the transistor 37.

The other voltage level generating subsections 3b and 3c which have exactly the same construction as the subsection 3a are operated in the same manner as the subsection 3a. The voltage levels appearing on the nodes 55 and 56 oscillate in synchronism with the oscillation period T of their associated nodes 52 and 53 of the ring oscillator 2. Consequently, the output periods T of the drive level generating subsections 3a, 3b and 3c are delayed by a predetermined phase relative to each other, as understood from the waveforms on nodes 54, 55 and 56 shown in FIG. 5. Due to such a delay in phase, the drive voltage level VIN substantially equal to the reference level Vr is constantly outputted by at least one of the three subsections 3a, 3b and 3c. It follows that the drive voltage level VIN regulated to the predetermined level Vr is constantly fed to the semiconductor device 4, as depicted at the bottom of FIG. 5.

It will be seen from the above that the number of drive voltage level generating subsections such as 3a to be included in the drive potential generator 3 and, therefore, the number of subsections such as 26 of the ring oscillator 2 is dependent upon the predetermined amount of phase delay of the subsections 3a and others as stated above. More specifically, the amount of phase delay is dependent upon the circuit constant of the drive level generating subsections 3a and others. Hence, so long as the total phase delay of all the drive level generating subsections included in the drive level generator 3 is substantially equal to the output period T of the drive level generator 3, the output voltage level VIN of the drive level generator 3 remains substantially equal to the reference level Vr throughout the output period T. The number of drive level generating subsections such as 3a is selected to maintain such a relationship for the previously stated phase delay.

In the illustrative embodiment, the predetermined phase delay is selected to be 120 electrical degrees because, as shown in FIG. 5, the period of time during which the frequency signal appearing on any of the nodes 51, 52 and 53 has a high level corresponds at least to 120 electrical degrees. Hence, assuming that the duration of a high level of the frequency signal appearing on the nodes such as 51 substantially 180 electrical degrees by way of example, then the predetermined phase delay need only be 180 degrees and therefore achievable with two subsections such as 26 and two subsections such as 3a. Likewise, when the duration of a high level of the frequency signal substantially corresponds to 90 electrical degrees, a phase delay of 90 electrical degrees and therefore only four subsections such as 26 and 3a will suffice.

With the above construction, the embodiment shown and described allows power for driving the semiconductor device 4 to be obtained from the external power source VDD. Hence, even a semiconductor circuit load of the kind consuming substantial power can be readily driven by power which is supplied at the stable drive voltage level VIN which is substantially equal to the reference level Vr. Moreover, the ring oscillator 2 is implemented by CMOS FETs which consume a minimum of power. This, coupled with the fact that the reference level generator 1 and drive level generator 3 also consume a minimum of power, reduces power consumption of the drive circuit as a whole and thereby the generation of heat, promoting the fabrication of a highly integrated circuit which hardly brings about a problem of heat.

In summary, in accordance with the present invention, it is not that an essential drive power is fed from a drive circuit itself to a semiconductor device which uses the drive circuit but that drive power is fed from an external power source to a semiconductor device. Hence, even a current large enough to drive a semiconductor device which constitutes a relatively heavy load can be fed to the device at a regulated predetermined reference potential. The entire drive circuit consumes only small power because a reference potential generator consumes only the operating power of a ring oscillator and a drive potential generator which need only small power, promoting high integration of such a drive circuit.

While the present invention has been described with reference to the particular illustrative embodiment, it is not to be restricted by the embodiment but only the the appended claims. It is to be appreciated that those skilled in the art can change or modify the embodiment without departing from the scope and spirit of the present invention.

What is claimed is:

1. A drive circuit for driving a semiconductor load circuit, comprising:
    reference voltage level generator means for outputting a reference voltage level which is associated with an input voltage level from an external power source;
    ring oscillator means responsive to the reference voltage level for oscillating a frequency signal having a predetermined frequency; and
    drive voltage level generator means responsive to the reference voltage level and the frequency signal for producing a drive voltage level which is constantly substantially equal to the reference voltage level in synchronism with the frequency signal;
    said drive voltage level generator means feeding power from said external power source to said semiconductor load circuit at the drive voltage level.

2. A drive circuit in accordance with claim 1, wherein said ring oscillator means comprises at least two oscillating circuits each oscillating the frequency signal which oscillates between the reference voltage level and ground level at the predetermined frequency, the frequency signal differing from one of said oscillating circuits to the other by a predetermined phase;
    said drive voltage level generating means comprising a plurality of voltage level generating circuits each associated with a respective one of said oscillating circuits, each of said voltage level generating circuits being responsive to the frequency signal outputted by associated one of said oscillating circuits for feeding power from said external power source to said semiconductor load circuit only when the frequency signal remains at the reference voltage level;
    the predetermined phase being selected such that a sum of the predetermined phases of all of said oscillating circuits is substantially equal to a period of the frequency signals.

3. A drive circuit in accordance with claim 1, wherein said ring oscillator means comprises three oscillating circuits each oscillating the frequency signal which oscillates between the reference voltage level and ground level at the predetermined frequency, the frequency signal differing from one of said three oscillating circuits to another by a predetermined phase;

said drive voltage level generator means comprising three voltage level generating circuits each being associated with a respective one of said oscillating circuits, each of said voltage level generating circuits being responsive to the frequency signal outputted by associated one of said oscillating circuits for feeding power from said external power source to said semiconductor load circuit only when the frequency signal remains at the reference voltage level;

the predetermined phase being selected to be substantially equal to 120 electrical degrees so that a sum of the predetermined phases of all of said oscillating circuits is substantially equal to a period of the frequency signals.

4. A drive circuit in accordance with claim 2, wherein said oscillating circuits each includes a complementary field effect transistor in which a pair of IGFETs each having a channel of opposite conductivity to a channel of the other, the frequency signal being outputted from a node between a source and a drain of said pair of IGFETs;

said voltage level generating circuits each comprising:

capacity means to which the frequency signal outputted by any of said voltage level generating circuits which is associated with said voltage level generating circuit is applied;

a first IGFET circuit having a source-drain path for feeding power from said external power source to said semiconductor load circuit; and a second IGFET circuit responding to the frequency signal via said capacity means for controlling said source-drain path of said first IGFET circuit;

one end of said source-drain path of said first IGFET circuit in each of said voltage level generating circuits being connected to said semiconductor load circuit.

5. A drive circuit in accordance with claim 4, wherein said reference voltage level generating means comprises a pair of IGFETs which are connected in series between said external power source and ground to divide an input voltage from said external power source to thereby output the reference voltage level.

6. A drive circuit in accordance with claim 5, wherein said reference voltage level generator means, said ring oscillator means, said drive voltage level generator means and said semiconductor load circuit constitute a single semiconductor device.

* * * * *